United States Patent [19]

Arai

[11] Patent Number: 4,910,232

[45] Date of Patent: Mar. 20, 1990

[54] ULTRAVIOLET-CURABLE ORGANOPOLYSILOXANE COMPOSITION

[75] Inventor: Masatoshi Arai, Gunma, Japan

[73] Assignee: Shin-Etsu Chemical Co., Ltd., Tokyo, Japan

[21] Appl. No.: 215,958

[22] Filed: Jul. 7, 1988

[30] Foreign Application Priority Data

Jul. 7, 1987 [JP] Japan .................. 62-169420

[51] Int. Cl.$^4$ .................. C08F 2/50; C08F 30/08; C08G 77/20

[52] U.S. Cl. .................. 522/33; 522/34; 522/36; 522/39; 522/42; 522/43; 522/44; 522/45; 522/46; 522/48; 522/65; 522/67; 522/68; 522/99; 528/32; 556/440; 526/279

[58] Field of Search .................. 522/99, 33, 34, 36, 522/39, 42, 43, 44, 45, 46, 48, 65, 67, 68; 528/32; 556/440

[56] References Cited

U.S. PATENT DOCUMENTS

| | | | |
|---|---|---|---|
| 3,878,263 | 4/1975 | Martin | 528/32 |
| 4,139,519 | 2/1979 | Itoh et al. | 525/105 |
| 4,504,629 | 3/1985 | Lien et al. | 525/288 |
| 4,575,545 | 3/1986 | Nakos et al. | 526/242 |
| 4,575,546 | 3/1986 | Klemarcyak et al. | 526/245 |
| 4,595,471 | 6/1986 | Preiner et al. | 522/29 |
| 4,683,278 | 7/1987 | Suzuki | 528/32 |

FOREIGN PATENT DOCUMENTS 59-64669  4/1984  Japan .................. 522/99

*Primary Examiner*—John C. Bleutge
*Assistant Examiner*—Ralph H. Dean, Jr.
*Attorney, Agent, or Firm*—Millen, White & Zelano

[57] ABSTRACT

The ultraviolet-curable organopolysiloxane composition of the invention comprises (A) an organopolysiloxane having bonded to a silicon atom thereof a silyl-substituted ethyl group represented by the general formula

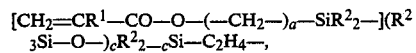

$[CH_2=CR^1-CO-O-(-CH_2-)_a-SiR^2_2-](R^2_3Si-O-)_cR^2_{2-c}Si-C_2H_4-,$ in which $R^1$ is a hydrogen atom or a methyl group, $R^2$ is a monovalent hydrocarbon group, a is 1, 2 or 3 and c is 1 or 2, and (B) a photopolymerization initiator. The composition is rapidly cured by ultraviolet irradiation into a gel-like material having adhesiveness without the disadvantages of catalyst poisoning and undue volume shrinkage so that the composition is useful as a potting agent in electronic and electric components.

8 Claims, No Drawings

ULTRAVIOLET-CURABLE ORGANOPOLYSILOXANE COMPOSITION

BACKGROUND OF THE INVENTION

The present invention relates to an ultraviolet-curable organopolysiloxane composition, more particularly, to an organopolysiloxane composition having no corrosiveness and no offensive odor and which is curable by irradiation with ultraviolet light into a gel-like material having stickiness which is useful, for example, as an encapsulating and potting agent in electronic components.

Gel-like materials obtained by curing an organopolysiloxane composition are widely used as a potting agent and adhesive in various kinds of electronic components such as hybrid ICs and the like by utilizing their low elastic modulus and high adhesive bonding strength.

The crosslinks forming such an organopolysiloxane gel are typically obtained by the addition reaction between silicon-bonded vinyl groups in an organopolysiloxane and silicon-bonded hydrogen atoms in an organohydrogenpolysiloxane in the presence of a platinum catalyst. It is usual that an organopolysiloxane composition for obtaining an organopolysiloxane gel by the addition reaction is heated at a temperature of, for example, 80° C. to 150° C. in order to obtain a practical velocity of the reaction. This temperature of heating to accelerate curing of the organopolysiloxane composition is sometimes too high when the organopolysiloxane gel is used in an electronic component because certain electronic devices cannot withstand such an elevated temperature. Another problem in an organopolysiloxane composition of this type is poisoning of the platinum catalyst when the composition is contacted with a phosphorus- or sulfur-containing compound or an ionic compound of a heavy metal such as tin, antimony, mercury, bismuth and the like, to cause loss of the catalytic activity so that the composition can no longer be cured even by heating. Drawbacks are sometimes caused therefore when the organopolysiloxane composition is contacted with a solder alloy or a soldering flux indispensably used in the assemblage works of electronic components. This problem is one of the factors which limit the applicability of the composition in the electronic industry.

In addition, the curable organopolysiloxane composition of the above mentioned type has another serious defect in that the volume shrinkage of the composition in curing by heating is considerably large so that cracks and fissures are sometimes formed in the mass of potting gel, especially when the mass is large.

In view of the above mentioned problems and disadvantages in the conventional organopolysiloxane compositions for a crosslinked gel, it is eagerly desired in the electronic industry because of a recent trend toward compounding of electronic parts and devices to develop an improved curable organopolysiloxane composition capable of giving a gel-like material upon curing without the problems and disadvantages in the prior art.

In this regard, the inventor has conducted extensive investigations to develop a curable organopolysiloxane composition which meets the above mentioned requirements and previously proposed an organopolysiloxane composition which comprises an organopolysiloxane having, in a molecule, at least one silyl-substituted ethyl group represented by the general formula

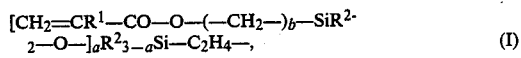

$$[CH_2=CR^1-CO-O-(-CH_2-)_b-SiR^2{}_{2}-O-]_a R^2{}_{3-a}Si-C_2H_4-, \quad (I)$$

in which $R^1$ is a hydrogen atom or a methyl group, $R^2$ is an optionally substituted monovalent hydrocarbon group and the subscripts a and b are each 1, 2 or 3, and a photopolymerization initiator, which composition is useful for use in electric and electronic components since the composition is readily cured by irradiation with ultraviolet light into a rubbery elastomer and is free from the problem of catalyst poisoning. The organopolysiloxane composition of this type, however, is not always quite satisfactory as a potting or sealing agent of electric and electronic components because the composition after curing has no adhesiveness to the substrate surface on which it has been cured.

SUMMARY OF THE INVENTION

The present invention accordingly has as an object to provide a novel and improved ultraviolet-curable organopolysiloxane composition freed from the above described problems and disadvantages in the prior art organopolysiloxane compositions curable by ultraviolet irradiation.

Thus, the ultraviolet-curable organopolysiloxane composition of the present invention comprises, in admixture: (A) an organopolysiloxane having, in a molecule, at least one silyl-substituted ethyl group represented by the general formula

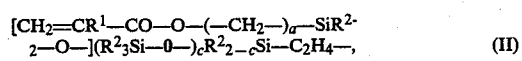

$$[CH_2=CR^1-CO-O-(-CH_2-)_a-SiR^2{}_{2}-O-](R^2{}_3Si-O-)_c R^2{}_{2-c}Si-C_2H_4-, \quad (II)$$

in which $R^1$ is a hydrogen atom or a methyl group, $R^2$ is an optionally substituted monovalent hydrocarbon group, the subscript a is 1, 2 or 3 and the subscript c is 1 or 2, and bonded to a silicon atom of the organopolysiloxane molecule; and (B) a photopolymerization initiator in an amount sufficient to promote the photopolymerization of the component (A), for example, in the range from 0.01 to 10 parts by weight per 100 parts by weight of the component (A).

DETAILED DESCRIPTION OF THE PREFERRED EMBODIMENTS

As is described above, the characteristic ingredient of the inventive organopolysiloxane composition is the component (A) which is an organopolysiloxane having, in its molecule, at least one group represented by the general formula (II) given above. The composition of the invention comprising the organopolysiloxane and a photopolymerization initiator has no corrosiveness and no offensive or unpleasant odor and is very rapidly cured by the irradiation with ultraviolet light to give a gel-like material which exhibits very little volume shrinkage and is free from formation of cracks even when a large mass of the composition has been cured. In addition, the curability of the inventive composition is absolutely free from the problem of catalyst poisoning so that the organopolysiloxane of the invention can be used in a wide variety of applications without taking the problem of catalyst poisoning into consideration.

The component (A) comprised in the inventive composition is an organopolysiloxane which is characterized by the specific silicon-bonded group represented by the above given general formula (II). In the formula, $R^1$ is a hydrogen atom or a methyl group and the groups denoted by $R^2$ are, each independently from the others, a monovalent hydrocarbon group exemplified by alkyl groups such as methyl, ethyl, propyl and butyl groups, cycloalkyl groups such as cyclohexyl group, alkenyl groups such as vinyl and allyl groups and aryl groups such as phenyl and tolyl groups as well as substituted monovalent hydrocarbon groups obtained by replacing a part or all of the hydrogen atoms in the above named hydrocarbon groups with halogen atoms, cyano groups and the like, exemplified by chloromethyl, 3,3,3-trifluoropropyl and 2-cyanoethyl groups. The subscript a is 1, 2 or 3 and the subscript c is 1 or 2. The organopolysiloxane as the component (A) in the inventive composition should have at least one such group in the molecule. Such an organopolysiloxane is novel.

Examples of organopolysiloxanes suitable as the component (A) include those expressed by the following structural formulas, in which the symbols Me and Ph denote methyl and phenyl groups, respectively:

[CH$_2$=CH—CO—O—CH$_2$—SiMe$_2$—O—](Me$_3$Si—O—)$_2$Si—C$_2$H$_4$—SiMe$_2$—[—O—SiMe$_2$—]$_{1.98}$—[—O—SiPh$_2$—]$_{22}$—O—SiMe$_2$—C$_2$H$_4$—Si(—O—SiMe$_3$)$_3$;

[CH$_2$=CH—CO—CH$_2$—SiMe$_2$—O—](Me$_3$Si—O—)MeSi—C$_2$H$_4$—SiMe$_2$—[—O—SiMe$_2$—]$_{1.49}$—[—O—SiPh$_2$—]$_{22}$—O—SiMe$_2$—C$_2$H$_4$—SiMe(—O—SiMe$_3$)$_2$;

[CH$_2$=CMe—CO—0—(—CH$_2$—)$_3$—SiMe$_2$—O—](Me$_3$Si—O—)MeSi—C$_2$H$_4$—SiMe$_2$—[—O—SiMe$_2$—]$_{198}$—O—SiMe$_2$—C$_2$H$_4$—SiMe(—O—SiMe$_3$)$_2$. and

[CH$_2$=CH—CO—0—CH$_2$—SiMe$_2$—O—](Me$_3$Si—O—)$_2$Si—C$_2$H$_4$—SiMe$_2$—[—O—SiMe$_2$—]$_{198}$—[—O—SiPh$_2$—]$_{22}$—O—SiMe$_2$—C$_2$H$_4$—Si(—O—SiMe$_3$)$_2$[—O—SiMe$_2$—CH$_2$—O—CO—CH=CH$_2$].

The organopolysiloxanes expressed by the above given structural formulas can be synthesized, for example, by the procedure described below. Thus, an organopolysiloxane having a group represented by the general formula $$[CH_2=CH—(R^3)_p—]SiR^4{}_2—O—, \quad (III)$$

in which $R^3$ is a divalent hydrocarbon group, $R^4$ is a methyl or a phenyl group and the subscript p is zero or 1, is used as a starting material. Examples of such an organopolysiloxane include those expressed by the following structural formulas:

CH$_2$=CH—SiMe$_2$—[—O—SiMe$_2$—]$_{149}$—CH=CH$_2$;
CH$_2$=CH—SiMe$_2$—[—O—SiMe$_2$—]$_{68}$—[—O—SiPh$_2$—]$_{30}$—O—SiMe$_2$—CH=CH$_2$;
CH$_2$=CH—SiMe$_2$—[—O—SiMe$_2$—]$_{6.8}$—[—O—SiMe(CH$_2$CH$_2$CF$_3$)—]$_{3.0}$—O—SiMe$_2$—CH=CH$_2$; and
Me$_3$Si—[—O—SiMe$_2$—]$_{195}$—[—O—SiMe(CH=CH$_2$)—]$_3$—O—SiMe$_3$.

The organopolysiloxane having the group represented by the general formula (III) is reacted with a chlorosilane compound represented by the general formula $$HSiMe_qCl_{3-q}, \quad (IV)$$

in which the subscript q is zero, 1 or 2, exemplified by MeHSiCl$_2$, HSiCl$_3$ and the like at a temperature of 50° C. to 80° C. in the presence of a platinum catalyst, such as an isopropyl alcohol solution of chloroplatinic acid, to effect the so-called hydrosilation reaction so that the group represented by the general formula (III) is converted into a group represented by the general formula $$Cl_{3-q}SiMe_q—CH_2CH_2—(R^3)_p—SiR^4{}_2—O—, \quad (V)$$

in which the symbols each have the same meaning as defined above.

Examples of organopolysiloxanes having a group represented by the general formula (V) above include those the following structural formulas:

Cl$_2$SiMe—C$_2$H$_4$—SiMe$_2$—[—O—SiMe$_2$—]$_{149}$—C$_2$H$_4$—SiMeCl$_2$;
ClSiMe$_2$—C$_2$H$_4$—SiMe$_2$—[—O—SiMe$_2$—]$_{149}$—C$_2$H$_4$—SiMe$_2$Cl;
Cl$_3$Si—C$_2$H$_4$—SiMe$_2$—[—O—SiMe$_2$—]$_{6.8}$—[—O—SiPh$_2$—]$_{30}$—O—SiMe$_2$—C$_2$H$_4$—SiCl$_3$;
Cl$_2$SiMe—C$_2$H$_4$—SiMe$_2$—[—O—SiMe$_2$—]$_{6.8}$—[—O—SiMe(CH$_2$CH$_2$CF$_3$)—]$_{3.0}$—O—SiMe$_2$—C$_2$H$_4$—SiMeCl$_2$; and
Me$_2$Si—[—O—SiMe$_2$—]$_{195}$—[—O—SiMe(CH$_2$CH$_2$SiCl$_3$)—]$_3$—O—SiMe$_3$.

Next, the organopolysiloxane having the group of the general formula (V) is subjected to a dehydrochlorination reaction with a (meth)acryloxyalkyl silanol compound, such as acryloxymethyl dimethyl silanol, 3-acryloxypropyl dimethyl silanol, methacryloxymethyl dimethyl silanol, 3-methacryloxypropyl dimethyl silanol and the like, at room temperature in the presence of a hydrogen chloride acceptor such as triethyl amine and then reacted with a triorganosilanol represented by the general formula $R^2{}_3SiOH$, such as trimethyl silanol, bis(trimethylsiloxy) methyl silanol, tris(trimethylsiloxy) silanol and the like, at room temperature in the presence of a hydrogen chloride acceptor.

The organopolysiloxane employed as the component (A) should have at least one of the characterizing groups of the general formula (II) in its molecule. It is noted that the average number of the groups of the general formula (II) per molecule in the organopolysiloxane as the component (A) should not exceed 1.8 or, preferably, should not exceed 1.2. On the other hand, the organopolysiloxane as the component (A) may be admixed with another organopolysiloxane without the characterizing group of the general formula (II) in such an amount that the average number of the groups of the general formula (II) in the mixture of the component (A) and the second organopolysiloxane is in the range from 0.5 to 1.8 or, preferably, from 0.5 to 1.2 per molecule. Such an additional organopolysiloxane is typically represented by the general formula R$_3$Si—O—[—SiR$_2$—O—]$_n$—SiR$_3$, in which R is a monovalent hydrocarbon group exemplified by alkyl groups, e.g., methyl, ethyl, propyl and butyl groups, alkenyl groups, e.g., vinyl and allyl groups, and aryl groups, e.g., phenyl and tolyl groups, and n is a positive integer.

The second ingredient, i.e. component (B), in the inventive composition is a photopolymerization initiator which promotes the photopolymerization of the (meth)acrylic groups in the organopolysiloxane as the component (A). Any of known compounds conventionally used as a photopolymerization initiator can be used in the present invention. Examples of suitable photopolymerization initiator compounds include acetophenone, propiophenone, benzophenone, xanthone, fluorenone, benzaldehyde, anthraquinone, triphenyl amine, carbazole, 3-methyl acetophenone, 4-methyl acetophenone, 3-pentyl acetophenone, 4-methoxy acetophenone, 3-bromo acetophenone, 4-allyl acetophenone, 1,4-diacetyl benzene, 3-methoxy benzophenone, 4-methyl benzophenone, 4-chloro benzophenone, 4,4'-dimethoxy benzophenone, 4-chloro-4'-benzyl benzophenone, 3-chloro xanthone, 3,9-dichloro xanthone, 3-chloro-8-nonyl xanthone, benzoin methyl ether, benzoin butyl ether, bis(4-dimethylamino phenyl) ketone, benzyl methoxy ketal, 2-chloro thioxanthone, diethyl acetophenone, diethoxy acetophenone, 1-hydroxy cyclohexyl phenyl ketone, 2-methyl-[4-(methylthio)phenyl]-2-morpholino-1-propanone, 2-hydroxy-2-methyl-1-phenyl propen-1-one and the like. The amount of the photopolymerization intiator as the component (B) in the inventive composition is not particularly limitative depending on the desired velocity of the photopolymerization of the component (A) or curing velocity of the composition. As a rough measure, however, the amount of the component (B) is preferably in the range from 0.01 to 10 parts by weight per 100 parts by weight of the organopolysiloxane as the component (A). When the amount thereof is too small, substantially no promoting effect can be obtained on the photopolymerization of the component (A). When the amount thereof is too large, on the other hand, the curing behavior of the organopolysiloxane gel obtained from the composition is adversely influenced.

The organopolysiloxane composition of the present invention can be prepared basically by uniformly blending the components (A) and (B) each in a calculated and weighed amount. It is optional that the inventive composition is admixed with a limited amount of a silica-based filler having no adverse influences on the photocurability of the composition with an object to improve mechanical properties of the organopolysiloxane gel obtained from the inventive composition.

The ultraviolet-curable organopolysiloxane composition of the present invention obtained in the above described manner can be readily cured into a gel of silicone within a short time of 1 to 20 seconds when it is irradiated with ultraviolet light by virtue of the photopolymerizable acryloxy-substituted organosilyl groups contained in the organopolysiloxane as the component (A). The composition has absolutely no corrosiveness and no offensive odor and is capable of being adhesively bonded to the surface of various kinds of substrate materials on which the composition has been cured by the ultraviolet irradiation so that the inventive composition is particularly useful as a potting agent, sealing agent and coating agent of various kinds of electric and electronic parts and components.

Following are a synthetic example for the preparation of the organopolysiloxane as the component (A) and examples of the inventive ultraviolet-curable organopolysiloxane composition formulated therewith, in which the term "parts" always refers to "parts by weight".

SYNTHETIC EXAMPLE

Into a glass flask of 1 liter capacity equipped with a thermometer and a stirrer were introduced 500 g of an organopolysiloxane having a linear molecular structure terminated at both molecular chain ends with dimethyl vinyl silyl groups and expressed by the structural formula

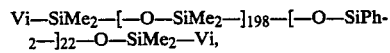

in which the symbols Me, Ph and Vi each denote methyl, phenyl and vinyl groups, respectively, and containing 0.010 mole of vinyl groups per 100 g, and the organopolysiloxane was dehydrated by heating for 2 hours at 120° C. under a stream of nitrogen gas. After cooling, the organopolysiloxane was admixed with 0.1 g of a solution of chloroplatinic acid in isopropyl alcohol in a concentration of 2% by weight as platinum and 7.0 g of methyl dichlorosilane and the mixture was heated first at 50° C. for 1 hour and then at 80° C. for 3 hours to effect the hydrosilation reaction followed by bubbling of nitrogen gas into the reaction mixture at the same temperature to remove the unreacted methyl dichlorosilane.

Thereafter, the reaction mixture was admixed with 20 g of triethyl amine and 0.1 of 3,5-di-tert-butyl-4-hydroxy toluene and further 5.1 g (0.025 mole) of acryloxymethyl dimethyl silane were added thereto dropwise over a period of 30 minutes followed by heating of the mixture at 60° C. for 2 hours to effect the reaction. The salt precipitated in the reaction mixture was removed by filtration and the filtrate was subjected to stripping at 100° C. under a reduced pressure of 2 mmHg to remove the excess amounts of triethyl amine and trimethyl silanol leaving 496 g of a liquid product having a viscosity of 4240 centistokes at 25° C., refractive index of 1.4503 at 25° C. and specific gravity of 1.026, which could be identified to be an organopolysiloxane expressed by the following structural formula

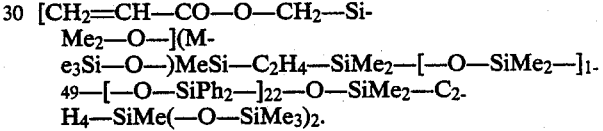

This product is referred to as the polysiloxane A hereinbelow.

EXAMPLES 1 TO 5 AND COMPARATIVE EXAMPLE 1.

Five organopolysiloxane compositions were prepared in Examples 1 to 5 each by admixing 100 parts of the polysiloxane A prepared above with a photopolymerization initiator of the kind and in an amount specified below.

Example 1: 0.3 part of phenyl hydroxycyclohexyl ketone

Example 2: 3.0 parts of phenyl hydroxycyclohexyl ketone

Example 3: 2.0 parts of diethoxy acetophenone

Example 4: 0.5 parts of 2-hydroxy-2-methyl-1-phenyl propen-1-one

Example 5: 2.0 parts of 2-hydroxy-2-methyl-1-phenyl propen-1-one

Each of these compositions was spread and irradiated with ultraviolet light in a dose of 4.5 J/cm$^2$ by using an apparatus for ultraviloet irradiation (Model ASE-20, manufactured by Nippon Denshi Co.) so that the composition was converted into a gel-like form. It was found by a finger touch test that all of the gelled compositions in Examples 1 to 5 had stickiness. The of penetration values of these gelled compositions were determined according to the procedure specified in JIS K 2220 by using a ¼-inch microconsistency tester manufactured by Rigosha Co. to give the values of 83, 61, 58, 72 and 60 in Examples 1 to 5, respectively.

For comparison, the same test as above was undertaken in Comparative Example 1 excepting omission of the photopolymerization initiator to find that no curing took place by the ultraviolet irradiation in the same dose as above.

EXAMPLES 7 AND 8.

A photocurable organopolysiloxane composition was prepared by uniformly blending 60 parts of the polysiloxane A, 40 parts of a poly(dimethyl diphenyl siloxane) fluid expressed by the average formula Vi—SiMe2—[—O—SiMe2—]198—[—SiPh2—]22—O—SiMe2—Vi, and 1.0 parts of phenyl hydroxycyclohexyl ketone (Example 7).

The formulation of the photocurable organopolysiloxane composition in Example 8 was the same as above except that the amount of the polymer A and the poly(dimethyl diphenyl siloxane) fluid were 80 parts and 20 parts, respectively.

These organopolysiloxane compositions of Examples 7 and 8 were each irradiated with ultraviolet light in just the same manner as in the preceding examples so that the composition was converted into a gel-like material having stickiness. The penetration values of these gel-like materials were 110 and 95, respectively.

EXAMPLES 9 AND 10

An organopolysiloxane having two functional groups of the general formula (II), referred to as the polysiloxane B hereinbelow, expressed by the structural formula

[CH2=CH—CO—O—CH2—SiMe2—
—O—](Me3Si—O—)2Si——C2H4—SiMe2—
[—O—SiMe2—]198—[—O—SiPh2—]2-
2—O—SiMe2—C2H4—Si(—O—SiMe3)-
2[—O—SiMe2—CH2—O—CO—CH=CH2]

was prepared in a synthetic procedure similar to that described in Synthetic Example.

Two photocurable organopolysiloxane compositions were prepared in Examples 9 and 10 each in the same formulation as in Examples 7 and 8, respectively, except that the polysiloxane A in Examples 7 and 8 was replaced with the same amount of the polysiloxane B.

These organopolysiloxane compositions of Examples 9 and 10 were each irradiated with ultraviolet light in just the same manner as in the preceding examples so that the composition was converted into a gel-like material having stickiness. The penetration values of these gel-like materials were 53 and 41, respectively.

What is claimed is:

1. An ultraviolet-curable organopolysiloxane composition which comprises, in admixture:
   (A) an organopolysiloxane having bonded to a silicon atom at least one silyl-substituted ethyl group represented by the general formula

[CH2=CR1—CO—O—(—CH2—)$_a$—SiR2$_{2-c}$—O—](R2$_3$Si—O—)$_c$R2$_{2-c}$Si—C2H4—, in which R1 is a hydrogen atom or a methyl group, R2 is a monovalent hydrocarbon or a substituted monovalent hydrocarbon radical, the subscript a is 1, 2 or 3 and the subscript c is 1 or 2, and bonded to a silicon atom; and
   (B) a photopolymerization initiator in an amount sufficient to promote the photopolymerization of the component (A).

2. The ultraviolet-curable organopolysiloxane composition as claimed in claim 1 wherein the amount of the photopolymerization initiator as the component (B) therein is in the range of from 0.01 to 10 parts by weight per 100 parts by weight of the component (A).

3. The ultraviolet-curable organopolysiloxane composition as claimed in claim 1 wherein the photopolymerization initiator as the component (B) is selected from the group consisting of acetophenone, propiophenone, benzophenone, xanthone, fluorenone, benzaldehyde, anthraquinone, triphenyl amine, carbazole, 3-methyl acetophenone, 4-methyl acetophenone, 3-pentyl acetophenone, 4-methoxy acetophenone, 3-bromo acetophenone, 4-allyl acetophenone, 1,4-diacetyl benzene, 3-methoxy benzophenone, 4-methyl benzophenone, 4-chloro benzophenone, 4,4'-dimethoxy benzophenone, 4-chloro-4'-benzyl benzophenone, 3-chloro xanthone, 3,9-dichloro xanthone, 3-chloro-8-nonyl xanthone, benzoin methyl ether, benzoin butyl ether, bis(4-dimethylamino phenyl) ketone, benzyl methoxy ketal, 2-chloro thioxanthone, diethyl acetophenone, diethoxy acetophenone, 1-hydroxycyclohexyl phenyl ketone, 2-methyl-[4-(methylthio)phen-yl]-2-morpholino-1-propanone, and 2-hydroxy-2-methyl-1-phenylpropen-1-one.

4. The ultraviolet-curable organopolysiloxane composition as claimed in claim 1 wherein the amount of the silyl-substituted ethyl groups in the component (A) is in the range from 1.0 to 1.8 moles per mole of organopolysiloxane as the component (A).

5. The ultraviolet-curable organopolysiloxane composition as claimed in claim 1 which further comprises: (C) a diorganopolysiloxane represented by the general formula R3Si—O—[—SiR2—O—]$_n$SiR3, in which R is a monovalent hydrocarbon group and n is a positive integer, in such an amount that the amount of the silyl-substituted ethyl groups in the component (A) is in the range from 0.5 to 1.8 moles per mole of the total amount of the organopolysiloxane as the component (A) and the diorganopolysiloxane as the component (C).

6. A composition according to claim 1, wherein composition (A) is a compound selected from the group consisting of those of the following structural formulas, in which the symbols Me and Ph denote methyl and phenyl groups, respectively:

[CH2=CH—CO—O—CH2—SiMe2—O—](Me3Si—O—)2Si—C2H4—SiMe2—[—O—SiMe2—]198—[—O—SiPh2—]22—O—SiMe2—C2H4—Si(—O—SiMe3)3;

[CH2=CH—CO—O—CH2—SiMe2—O—](Me3Si—O—)MeSi—C2H4—SiMe2—[—O—SiMe2—]149—[—O—SiPh2—]22—O—SiMe2—C2H4—SiMe(—O—SiMe3)2;

[CH2=CMe—CO—O—(—CH2—)3—SiMe2—O—](Me3Si—O—)MeSi—C2H4—SiMe2—[—O—SiMe2—]198—O—SiMe2—C2H4—SiMe(—O—SiMe3)2; and

[CH2=CH—CO—O—CH2—SiMe2—O—](Me2Si—O—)2Si—C2H4—SiMe2—[—O—SiMe2—]198—[—O—SiPh2—]22—O—SiMe2—C2H4—Si(—O—SiMe3)2[—O—SiMe2—CH2—O—CO—CH=CH2].

7. An ultraviolet light curable organopolysiloxane having bonded to a silicon atom from 1.0 to 1.8 silyl substituted ethyl groups represented by the general formula $[CH_2=CR^1-CO-O-(-CH_2-)_a-SiR^2_2-O-](R^2_3Si-O-)CR^2_{2-c}Si-C_2H_4$, in which $R^1$ is a hydrogen atom or a methyl group, $R^2$ is an optionally substituted monovalent hydrocarbon group, the subscript a is 1, 2 or 3 and the subscript c is 1 or 2.

8. An organopolysiloxane according to claim 1, selected from the group consisting of those of the following structural formulas, in which the symbols Me and Ph denote methyl and phenyl groups, respectively:

$[CH_2=CH-CO-O-CH_2-SiMe_2-O-](Me_3Si-O-)_2Si-C_2H_4-SiMe_2-[-O-SiMe_2-]_{198}-[-O-SiPh_2-]_{22}-O-SiMe_2-C_2H_4-Si(-O-SiMe_3)_3$;

$[CH_2=CH-CO-O-CH_2-SiMe_2-O-](Me_3Si-O-)MeSi-C_2H_4-SiMe_2-[-O-SiMe_2-]_{149}-[-O-SiPh_2-]_{22}-O-SiMe_2-C_2H_4-SiMe(-O-SiMe_3)_2$;

$[CH_2=CMe-CO-O-(-CH_2-)_3-SiMe_2-O-](Me_3Si-O-)MeSi-C_2H_4-SiMe_2-[-O-SiMe_2-]_{198}-O-SiMe_2-C_2H_4-SiMe(-O-SiMe_3)_2$; and $[CH_2=CH-CO-O-CH_2-SiMe_2-O-](Me_2Si-O-)_2Si-C_2H_4-SiMe_2-[-O-SiMe_2-]_{198}-[-O-SiPh_2-]_{22}-O-SiMe_2-C_2H_4-Si(-O-SiMe_3)_2[-O-SiMe_2-CH_2-O-CO-CH=CH_2]$.

* * * * *